(12) United States Patent
Park et al.

(10) Patent No.: US 12,694,940 B2
(45) Date of Patent: Jul. 28, 2026

(54) NONVOLATILE MEMORY DEVICE, STORAGE DEVICE HAVING THE SAME, AND TESTING METHOD THEREOF

(71) Applicant: SAMSUNG ELECTRONICS CO., LTD., Suwon-si (KR)

(72) Inventors: Yongha Park, Suwon-si (KR); Seaeun Park, Suwon-si (KR); Saeeun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 18/761,985

(22) Filed: Jul. 2, 2024

(65) Prior Publication Data

US 2025/0166721 A1 May 22, 2025

(30) Foreign Application Priority Data

Nov. 21, 2023 (KR) ........................ 10-2023-0162559

(51) Int. Cl.
*G11C 29/32* (2006.01)
*G06F 11/22* (2006.01)
(52) U.S. Cl.
CPC .......... *G11C 29/32* (2013.01); *G06F 11/2273* (2013.01)
(58) Field of Classification Search
CPC ..... G11C 29/32; G11C 29/1201; G11C 29/48; G11C 16/08; G11C 16/10; G11C 29/12015; G11C 29/50012; G06F 11/2273
See application file for complete search history.

(56) References Cited

U.S. PATENT DOCUMENTS

| | | | | |
|---|---|---|---|---|
| 6,839,872 B2 * | 1/2005 | Kohda | .................. | H04L 69/323 |
| | | | | 370/245 |
| 7,401,277 B2 | 7/2008 | Yamada et al. | | |
| 7,568,141 B2 | 7/2009 | Menon et al. | | |
| 7,679,133 B2 | 3/2010 | Son et al. | | |
| 7,911,861 B2 * | 3/2011 | Ishikawa | ........... | G11C 29/1201 |
| | | | | 365/194 |
| 8,553,466 B2 | 10/2013 | Han et al. | | |
| 8,559,235 B2 | 10/2013 | Yoon et al. | | |
| 8,654,587 B2 | 2/2014 | Yoon et al. | | |
| 8,738,978 B2 | 5/2014 | Tekumalla et al. | | |
| 9,536,970 B2 | 1/2017 | Seol et al. | | |
| 9,696,377 B2 | 7/2017 | Wang et al. | | |
| 9,772,376 B1 | 9/2017 | Kawoosa et al. | | |
| 9,971,733 B1 * | 5/2018 | Teh | ..................... | G06F 13/4234 |
| 10,422,832 B2 | 9/2019 | Uemura | | |
| 10,790,039 B1 * | 9/2020 | Lee | ........................ | G11C 5/025 |
| 2007/0260952 A1 | 11/2007 | Devanathan et al. | | |
| 2009/0125770 A1 | 5/2009 | Parulkar | | |
| 2013/0114326 A1 * | 5/2013 | Lee | .................... | G11C 29/1201 |
| | | | | 365/189.17 |

(Continued)

*Primary Examiner* — Khamdan N. Alrobaie

(74) *Attorney, Agent, or Firm* — Sughrue Mion, PLLC

(57) ABSTRACT

A nonvolatile memory device includes at least one first universal interface bus (UIB) circuit coupled to a plurality of input/output (I/O) pads, at least one second UIB circuit coupled to the plurality of I/O pads, a core block including a first input terminal coupled to another block, and a plurality of second input terminals coupled to a first output terminal of the at least one first UIB circuit and a second output terminal of the at least one second UIB circuit, and at least one block configured to activate the at least one second UIB circuit.

10 Claims, 18 Drawing Sheets

(56)             References Cited

U.S. PATENT DOCUMENTS

| | | | |
|---|---|---|---|
| 2016/0163609 A1* | 6/2016 | Rahman | H10P 74/273 |
| | | | 257/48 |
| 2016/0377676 A1 | 12/2016 | Shor et al. | |
| 2018/0240531 A1* | 8/2018 | Wang | G11C 29/1201 |
| 2018/0268749 A1* | 9/2018 | Pappu | G09G 3/2096 |
| 2020/0217886 A1 | 7/2020 | Chen et al. | |
| 2022/0113889 A1* | 4/2022 | Park | G11C 29/022 |
| 2026/0004865 A1* | 1/2026 | Kim | G11C 29/12015 |

* cited by examiner

250

| Function Vector Simulation | ~S110 |

| Extraction of PI's Value from simulation results | ~S120 |

| ATPG extraction with PI's Value | ~S130 |

| Scan Vector insertion after Function Vector insertion | ~S140 |

UIB_D[7:0]

UIB
Circuit

PI : 1/0 (Controlled)

Core Block

NONVOLATILE MEMORY DEVICE, STORAGE DEVICE HAVING THE SAME, AND TESTING METHOD THEREOF

CROSS-REFERENCE TO RELATED APPLICATIONS

This application claims benefit of priority under 35 U.S.C. § 119 to Korean Patent Application No. 10-2023-0162559, filed on Nov. 21, 2023, in the Korean Intellectual Property Office, the disclosure of which is incorporated herein by reference in its entirety.

BACKGROUND

1. Field

The present disclosure relates generally to memory devices, and more particularly to a nonvolatile memory device, a storage device having the same, and a testing method thereof.

2. Description of Related Art

A scan test of a memory device may be performed to identify defects in memory cells and/or circuits. Such a scan test may improve product quality and/or may reduce production costs. For example, the scan tests may allow for detection of defective components early in a production cycle to potentially prevent errors and/or additional costs in subsequent production processes. Alternatively or additionally, a relatively high test coverage and/or ease of debugging may be provided to confirm the reliability of an entire memory device. Since direct access may be difficult in recent complex semiconductor designs, a special structure such as a wrapper may be required. The wrapper may serve to standardize testing of intellectual property (IP) blocks, provide a test access mechanism, and/or enable testing for a complex circuit region. In addition, the introduction of a wrapper may enable parallel testing of multiple IP blocks and/or circuit regions, thereby potentially reducing test time and costs. The reuse and standardization of tests may also be improved to confirm compatibility between various IP blocks, and/or to potentially simplify debugging and diagnosis of detected defects. These functions may significantly improve the efficiency and/or accuracy of scan tests.

SUMMARY

One or more example embodiments of the present disclosure provide a nonvolatile memory device performing a scan test, a storage device having the same, and a testing method thereof.

One or more example embodiments of the present disclosure provide a nonvolatile memory device for performing a scan test while reducing an occupied area, a storage device having the same, and a testing method thereof.

According to an aspect of the present disclosure, a nonvolatile memory device includes at least one first universal interface bus (UIB) circuit coupled to a plurality of input/output (I/O) pads, at least one second UIB circuit coupled to the plurality of I/O pads, a core block including a first input terminal coupled to another block, and a plurality of second input terminals coupled to a first output terminal of the at least one first UIB circuit and a second output terminal of the at least one second UIB circuit, and at least one block configured to activate the at least one second UIB circuit.

According to an aspect of the present disclosure, a testing method of a nonvolatile memory device includes receiving, through a plurality of I/O pads and in a UIB section, test data at each input terminal of a plurality of UIB circuits, and outputting, from each output terminal of the plurality of UIB circuits, the test data, in a scan section, to an input terminal of a core block.

According to an aspect of the present disclosure, a nonvolatile memory device includes a memory cell array including a plurality of memory cells coupled between a plurality of wordlines and a plurality of bitlines, a row decoder configured to select at least one of the plurality of wordlines, a page buffer circuit including a plurality of page buffers coupled to the plurality of bitlines, an I/O circuit configured to input first data to be stored in the plurality of page buffers, and to output second data stored in the plurality of page buffers, a voltage generator configured to generate a first voltage applied to selected wordlines of the plurality of wordlines and to generate a second voltage applied to unselected wordlines of the plurality of wordlines, and a control logic configured to control the row decoder, the page buffer circuit, the I/O circuit, and the voltage generator. The I/O circuit includes a plurality of UIB circuits coupled to a plurality of I/O pads. The control logic includes a scan block configured to perform a scan test operation using at least one of the plurality of UIB circuits.

According to an aspect of the present disclosure, a nonvolatile memory device includes a first scan block including a plurality of first input terminals coupled to a plurality of first pads and at least one second input terminal configured to receive test data, and at least one second scan block including an input terminal coupled to a plurality of second pads and an output terminal coupled to the at least one second input terminal of the first scan block. The at least one second scan block is configured to receive, in a function mode, the test data through the plurality of second pads, and output, in a scan mode, the test data to the at least one second input terminal.

According to an aspect of the present disclosure, a testing method of a nonvolatile memory device includes applying a function mode vector to a plurality of second scan blocks through a plurality of I/O pads, extracting primary input (PI) values of second input terminals of a first scan block of the nonvolatile memory device, extracting an automatic test pattern data having the PI values, and inserting a scan vector corresponding to the automatic test pattern data into first input terminals of the plurality of second scan blocks.

According to an aspect of the present disclosure, a storage device includes at least one nonvolatile memory device, and a controller configured to control the at least one nonvolatile memory device. The at least one nonvolatile memory device is configured to receive, in a function mode, test data through I/O pads, perform, in a scan mode, a scan test operation using the test data, and output result values of the scan test operation through scan pads.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
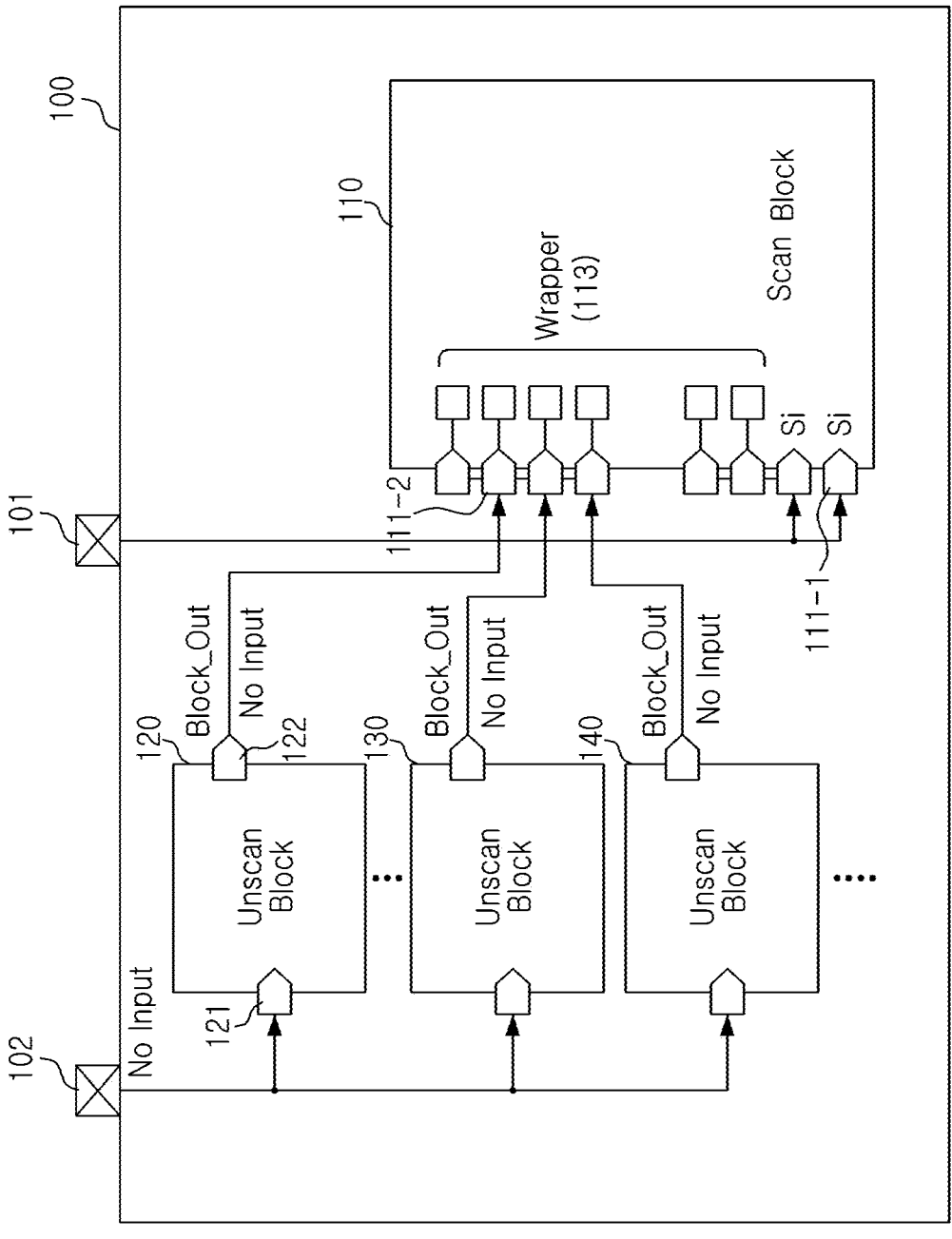
FIG. 1 is a diagram exemplarily illustrating a nonvolatile memory device performing a scan operation using a wrapper, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to describe various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

As used herein, when an element or layer is referred to as "covering" another element or layer, the element or layer may cover at least a portion of the other element or layer, where the portion may include a fraction of the other element or may include an entirety of the other element. Similarly, when an element or layer is referred to as "penetrating" another element or layer, the element or layer may penetrate at least a portion of the other element or layer, where the portion may include a fraction of the other element or may include an entire dimension (e.g., length, width, depth) of the other element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

In the present disclosure, the articles "a" and "an" are intended to include one or more items, and may be used interchangeably with "one or more." Where only one item is intended, the term "one" or similar language is used. For example, the term "a processor" may refer to either a single processor or multiple processors. When a processor is described as carrying out an operation and the processor is referred to perform an additional operation, the multiple operations may be executed by either a single processor or any one or a combination of multiple processors.

As used herein, each of the terms "SiN", "SiO", and the like may refer to a material made of elements included in each of the terms and is not a chemical formula representing a stoichiometric relationship Hereinafter, various embodiments of the present disclosure are described with reference to the accompanying drawings.

Recently, costs of analyzing and detecting defects in a memory device may have increased. Accordingly, it may be necessary to obtain a systematic methodology for providing detectable test coverage and potentially shortening defect analysis turnaround time (TAT). For example, a technique such as, but not limited to, wrapping may be used to potentially improve test coverage. However, a wrapping technology may have a significant size due to a primary input (PI) (e.g., an input of a scan target circuit) having a relatively large amount of design overhead, as compared to a core block (e.g., a scan target circuit). The PI may be and/or may include at least one of a controlled PI and an uncontrolled PI. In an embodiment, the uncontrolled PI may be a factor that may reduce test coverage.

A nonvolatile memory device, according to an embodiment, may enable an input of a test pattern of an uncontrolled PI through a scan test using a function mode/universal interface bus (UIB) circuit, thereby potentially providing controllability of a core PI.

Scan Test Using Function Mode

A nonvolatile memory device, according to an embodiment, may potentially improve scan test coverage using a function mode, when compared to a related memory device. The nonvolatile memory device may provide controllability of a PI through a function operation rather than a wrapper, which may allow to obtain test coverage without significantly increasing design overhead.

FIG. 1 is a diagram illustrating a nonvolatile memory device 100 performing a scan operation using a wrapper, according to an embodiment. Referring to FIG. 1, the nonvolatile memory device 100 may include a scan block 110 and a plurality of unscanned blocks (e.g., a first unscanned block 120, a second unscanned block 130, and a third unscanned block 140). The scan block 110 may be and/or may include a target circuit of a scan operation, and the plurality of unscanned blocks 120 140 may be and/or may include circuits that may not be subject to the scan operation. The scan block 110 may be connected to a scan pad 101. The plurality of unscanned blocks 120 to 140 may be connected to input/output (I/O) pads 102.

In an embodiment, the scan operation may be performed through a controllable PI 111-1 in a standby mode in which the nonvolatile memory device 100 is not performed. In such an embodiment, another unscanned block (e.g., the first unscanned block 120) may be connected to an uncontrolled PI 111-2 of the scan block 110 that may not operate in the standby mode. That is, the controllable PI 111-1 connected to the unscanned block may not be controlled, and may thus be referred to as an uncontrolled PI. Additionally, there may be no control means for the uncontrolled PI 111-2 that may not be controlled in a scan mode, which may cause a decrease in test coverage. In order to address the decrease in test coverage, a wrapper 113 may be added to provide controllability for the uncontrolled PI 111-2.

A nonvolatile memory device, according to an embodiment, may be configured to perform a scan operation without using such a wrapper.

Figure 2:
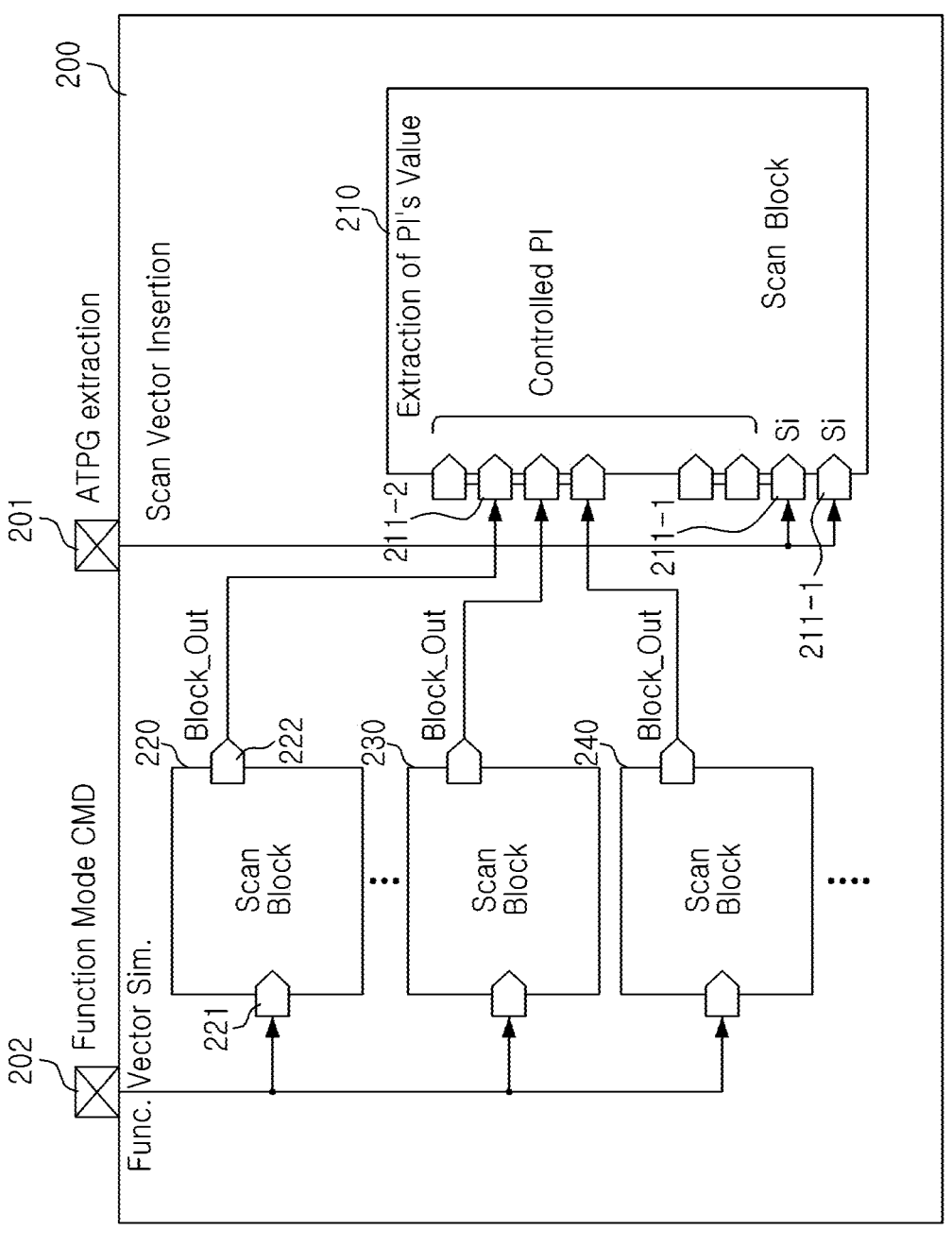
FIG. 2 is a diagram exemplarily illustrating a nonvolatile memory device, according to an embodiment.

FIG. 2 is a diagram illustrating a nonvolatile memory device 200, according to an embodiment. Referring to FIG. 2, the nonvolatile memory device 200 may include a first scan block 210 and a plurality of second scan blocks (e.g., a first second scan block 220, a second second scan block 230, and a third second scan block 240). The first scan block 210 may be and/or may include a target circuit of the scan operation.

The first scan block 210 may be and/or may include a directly controllable input terminal 211-1 through scan pads 201 and an indirectly controllable input terminal 211-2 through external I/O pads 202. The plurality of second scan blocks 220 to 240 may be and/or may include circuits connected to the indirectly controllable input terminal 211-2. Although FIG. 2 illustrates three (3) second scan blocks, the present disclosure is not limited thereto, and the nonvolatile memory device may be configured with less second scan blocks (e.g., two (2) or less) or more second scan blocks (e.g., four (4) or more). Notably, the nonvolatile memory device of the present disclosure may be configured with at least one first scan block and at least one second scan block.

As illustrated in FIG. 2, the nonvolatile memory device 200 may enter a function mode through the external I/O pads 202 to provide controllability. For example, upon entering the function mode, existing unscanned blocks may become controllable scan blocks. That is, controllability of the indirectly controllable input terminal 211-2 connected to the plurality of second scan blocks 220 to 240 may be obtained. For example, an existing uncontrolled PI may be changed to a controlled PI. Accordingly, a separate test coverage may be provided without potentially incurring in a significant design overhead, when compared to related memory devices.

Figure 3:
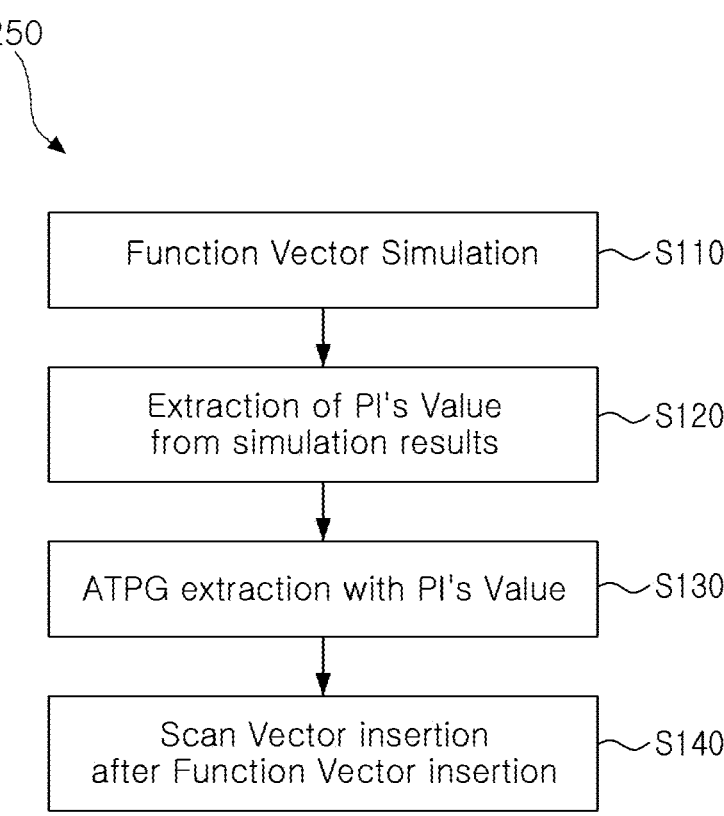
FIG. 3 is a flowchart illustrating a test operation of the nonvolatile memory device, according to an embodiment.

FIG. 3 is a flowchart illustrating a test operation of the nonvolatile memory device 200, according to an embodiment. Referring to FIGS. 2 and 3, a test operation 250 of the nonvolatile memory device 200 may be performed as follows. The performing of the test operation 250 may include performing a function vector simulation. That is, a function mode vector may be applied to the second scan blocks through the external I/O pads 202 (operation S110). Values of the PI may be extracted from simulation result values. That is, PI values of an indirectly controllable input terminal 211-2 of the first scan block 210 may be extracted (operation S120). For example, automatic test pattern generation (ATPG) extraction having PI values may be performed. That is, the automatic test pattern data having PI values may be extracted (operation S130). The scan vector insertion may be inserted after inserting the function vector. That is, the scan vector corresponding to the automatic test pattern data may be inserted into the directly controllable input terminal 211-1 of the first scan block 210 (operation S140).

In an example embodiment, a function mode command may be received through the external I/O pads 202. In an example embodiment, after performing an application to the plurality of second scan blocks 220 to 240, function mode vectors of output terminals of the plurality of second scan blocks 220 to 240 in the function mode may be output to the indirectly controllable input terminal 211-2 of the first scan block 210. In an example embodiment, a scan operation may be performed in response to a scan mode activation signal in the first scan block 210. In an example embodiment, result values of the scan operation may be output through the scan pads 201 connected to the indirectly controllable input terminal 211-2.

Figure 4:
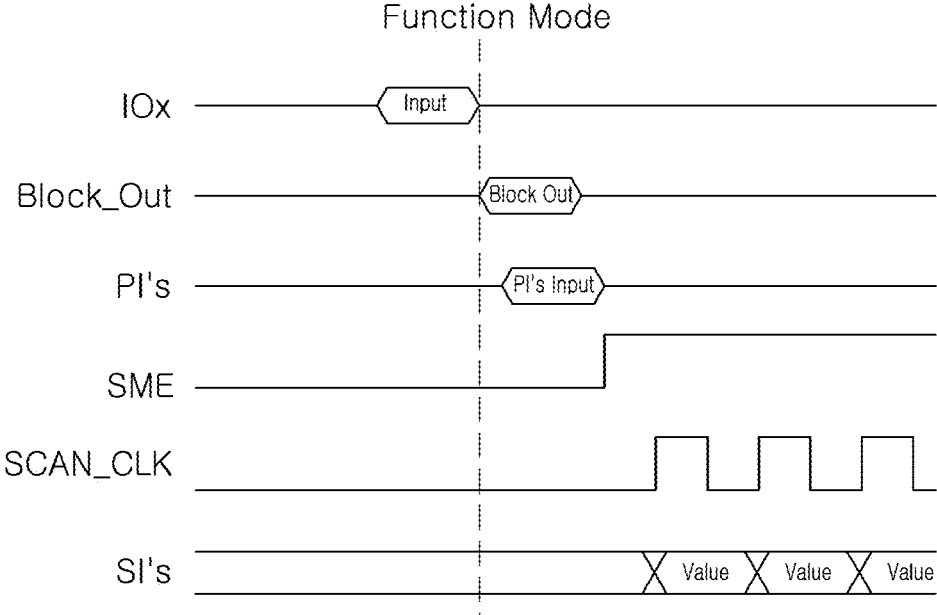
FIG. 4 is a diagram exemplarily illustrating a timing of a scan operation of the nonvolatile memory device, according to an embodiment.

FIG. 4 is a diagram illustrating a timing of a scan operation of the nonvolatile memory device 200, according to an embodiment. An operation of a typical scan test may be performed so that before a SCAN section, IOx may maintain a High-Z and/or Unknown state because no input value may be present, and a Block_Out value of an unscanned block may become Unknown. Accordingly, the PI of the scan block (or a core block) connected to Block-_Out may enter a scan mode in a state in which it may not be possible to provide controllability.

In an embodiment, in the nonvolatile memory device 200, a function mode entry section may begin before the SCAN section, as shown in FIG. 4. After a function mode command is applied through the external I/O pads 202, the function mode may be entered. The second scan block of the plurality of second scan blocks 220 to 240 that receives a function mode signal may generate an Output through a function operation. In such an embodiment, PI values of the indirectly controllable input terminal 211-2 of the first scan block 210 connected to Block_Out of the second scan block may be a state with a value other than Unknown. That is, a scan test operation may be possible in a state in which the controllability of the PI of the first scan block 210 is obtained. Furthermore, an entry into the scan mode may be activated, and test results may be output through the directly controllable input terminal 211-1 in response to a scan clock.

The nonvolatile memory device 200, according to an embodiment, may be configured to obtain the controllability of the PI through the function operation rather than a wrapper (e.g., wrapper 113 of FIG. 1). The nonvolatile memory device 200 may apply a function mode through a command to hold an operation after entering the function mode, and input scan data to perform a scan test. In an example embodiment, it may be possible to define a new scan test command. For example, the new scan test command may be expanded in a form of integrating the function mode and the scan mode.

In an embodiment in which a scan core block has a relatively large amount of primary input/primary output (PI/PO), when the PI/PO does not have a wrapper/TPI, test coverage may be relatively low. Alternatively or additionally, the nonvolatile memory device 200, according to an embodiment, may perform a function test before SI of the ATPG is applied in a mass production test pattern, thereby providing sufficient test coverage.

Scan Test Using UIB Circuit

A UIB circuit of a nonvolatile memory device may perform communication between a memory core and an external system. The UIB circuit may manage an input and/or output of data, process interface protocols to synchronize data transfer with a host system, maintain signal integrity by adjusting a voltage level and timing of a signal, and provide data accuracy through error detection and correction (ECC). Alternatively or additionally, the UIB circuit may interpret commands from a host and may initiate appropriate operations inside a NAND flash, and may monitor a state of a memory and may provide necessary information to the host. In an embodiment, a nonvolatile memory device may be configured to perform a scan test operation using the UIB circuit.

A nonvolatile memory device, according to an embodiment, may potentially improve test coverage using the UIB circuit to provide controllability of an uncontrolled PI during a scan test. For example, when examining a structure of the UIB circuit and the scan block of the nonvolatile memory device, blocks may frequently operate by receiving data from the UIB circuit.

Figure 5:
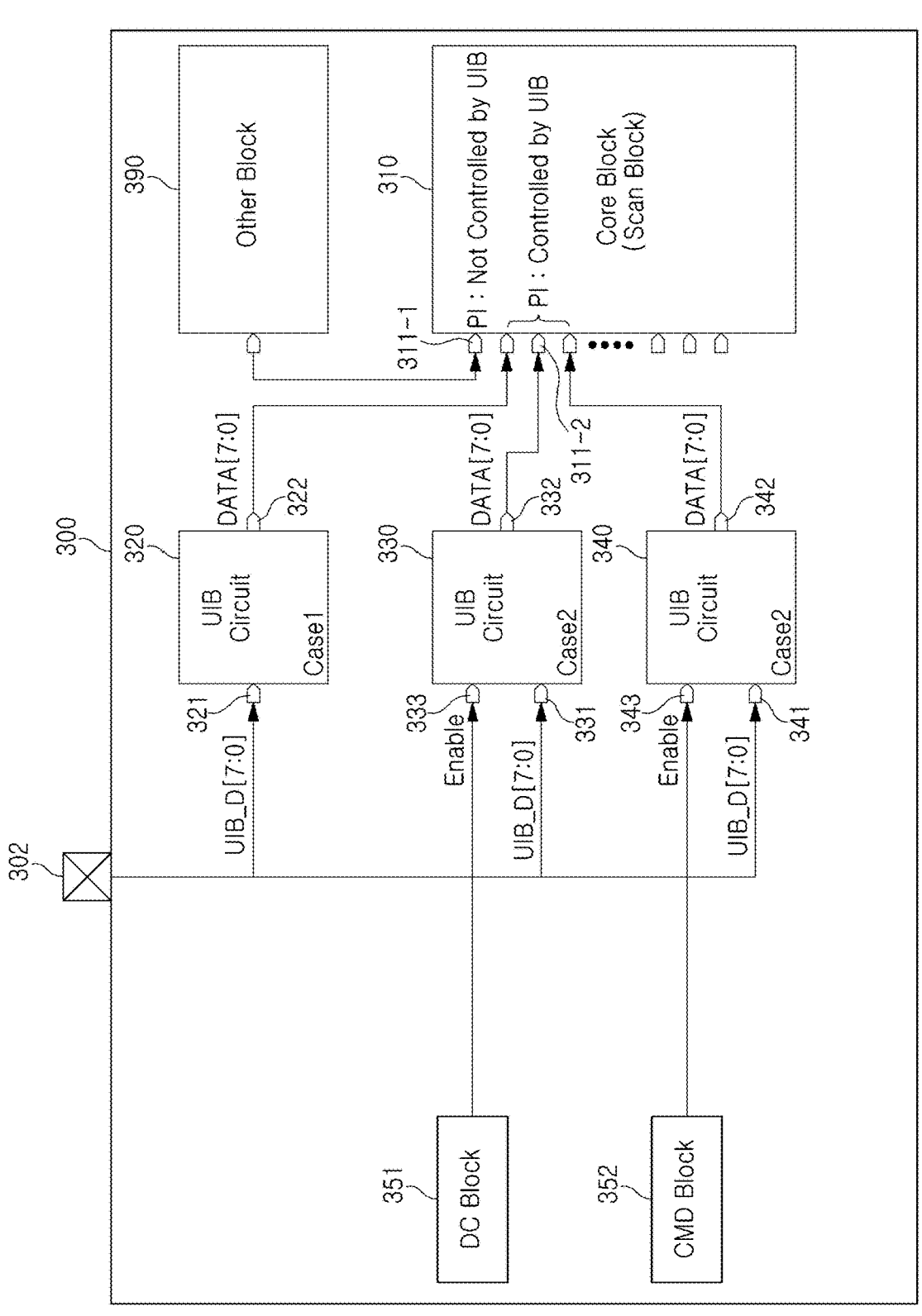
FIG. 5 is a diagram exemplarily illustrating a nonvolatile memory device, according to an embodiment.

FIG. 5 is a diagram illustrating a nonvolatile memory device 300, according to an embodiment. Referring to FIG. 5, the nonvolatile memory device 300 may include a core block 310, a plurality of UIB circuits (e.g., a first UIB circuit 320, a second UIB circuit 330, and a third UIB circuit 340), a plurality of first blocks (e.g., a DC block 351 and a CMD block 352), and a third block 390. Each UIB circuit of the plurality of UIB circuits 320 to 340 may be connected to a plurality of I/O pads 302. The nonvolatile memory device 300 may enable a test pattern input of the uncontrolled PI using the plurality of UIB circuits 320 to 340. The controllability of the PI may be configured through the function operation rather than a wrapper, thereby providing the test coverage without increasing design overhead.

A portion of the PIs of the core blocks of the nonvolatile memory device 300 may be connected to another block (e.g., the third block 390), and a portion thereof may be connected to output data of the UIB circuit. For example, among the PIs of the core block 310, a first portion 311-1 may be connected to the third block 390. A second portion 311-2 of the core block 310 may be connected to output data of the plurality of UIB circuits 320 to 340.

The plurality of UIB circuits 320 to 340 may be broadly divided into two types. In a first type of UIB circuit (e.g., the first UIB circuit 320), UIB data (e.g., UIB_D[7:0]) may be directly input to a PI. That is, the first UIB circuit 320 may receive the UIB data (UIB_D[7:0]) from an input terminal 321, and may output data (DATA[7:0]) corresponding to an output terminal 322. The output terminal 322 may be connected to PIs of the second portion 311-2 of the core block 310. A second type of UBI circuits (e.g., the second and third UIB circuits 330 and 340) may be input to the PI when the UIB data is activated. That is, the second UIB circuit 330 may input a scan mode activation signal SME to an activating terminal 333, may receive the UIB data (UIB_D[7:0]) from an input terminal 331, and may output data (DATA[7:0]) corresponding to an output terminal 332. The scan mode activation signal SME may be output to the DC block 351. Similarly, the third UIB circuit 340 may input the scan mode activation signal SME to an activating terminal 343, receive the UIB data (UIB_D[7:0]) from the input terminal 431, and may output data (DATA[7:0]) corresponding to an output terminal 342. The scan mode activation signal SME may be output to the CMD block 352.

Figure 6A:
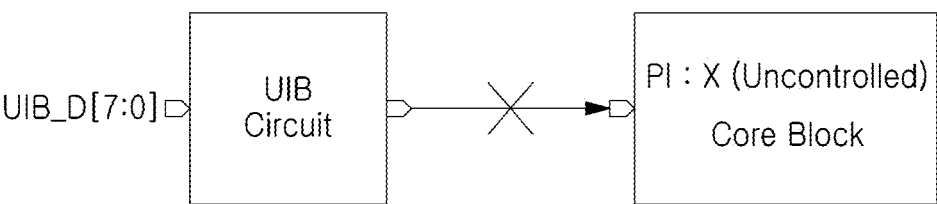
FIG. 6A is a diagram illustrating a state in which an output of an universal interface bus (UIB) circuit is connected to a primary input (PI) of a core block during a scan test, according to an embodiment.
Figure 6B:
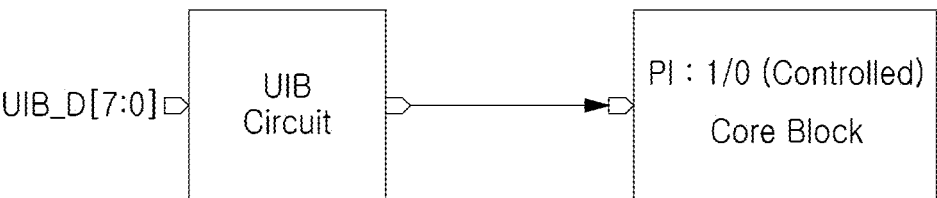
FIG. 6B is a diagram illustrating a state in which an output of the UIB circuit before a scan test is connected to a PI of a core block, according to an embodiment.

FIG. 6A is a diagram illustrating a state in which an output of a UIB circuit is connected to a PI of a core block during a scan test, according to an embodiment. FIG. 6B is a diagram illustrating a state in which an output of a UIB circuit is connected to a PI of the core block before the scan test, according to an embodiment. A previous scan test method may proceed with a scan method without UIB data application. As such, the PI of the core block connected to the UIB circuit may not be controlled at the time of the scan test. As shown in FIG. 6A, during a scan test, the first UIB circuit 320 may not apply UIB data. Consequently, an output of the corresponding first UIB circuit 320 may be an Unknown value, which may reduce controllability. As shown in FIG. 6B, the second UIB circuit 330 may receive the UIB data before the scan test, thereby applying a corresponding value to the PI of the core block 310. Accordingly, the controllability of the PI may be obtained.

Figure 7:
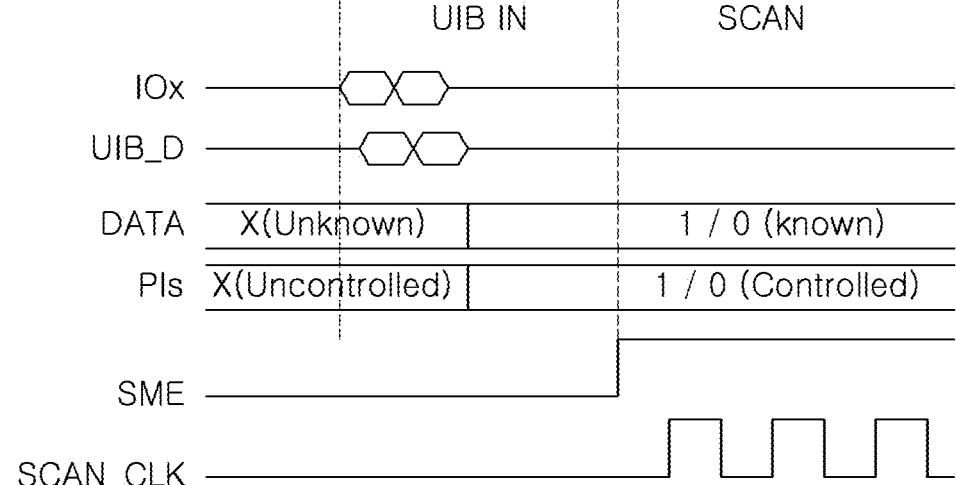
FIG. 7 is a diagram exemplarily illustrating a timing of a test operation of the nonvolatile memory device, according to an embodiment.

FIG. 7 is a diagram illustrating a timing of a test operation of a nonvolatile memory device, according to an embodiment. Referring to FIG. 7, UIB data may be input to an input terminal UIB_D of a first UIB circuit 320 through the plurality of I/O pads 302 in a UIB input section. Subsequently, a signal generated from a circuit in the scan section may be input as a scan mode activation signal SME of the first UIB circuit 320. When the scan mode activation signal SME is on a high level (e.g., logic high, "1"), data from the first UIB circuit 320 may be input to the PI of the core block 310. That is, the nonvolatile memory device 300 may not be able to generate a corresponding scan mode activation signal SME during the scan test in a UIB circuit. In other words, when the UIB data directly enters the PI, and the UIB input section begins before the scan section, the UIB data input through the I/O pads IOx may be output to an output terminal DATA of the UIB circuit through the input terminal UIB_D. Consequently, the nonvolatile memory device 300 may perform the scan test in a state of providing the controllability of the PI into which corresponding data may be entered. The scan test may be performed in response to a scan clock SCAN_CLK in response to the scan mode activation signal SME.

In an embodiment, by adding an OR gate to generate the scan mode activation signal SME of the UIB circuit during the scan test, when a scan test mode is in progress, an activation signal may be automatically input and data of the UIB circuit may be controlled.

Figure 8:
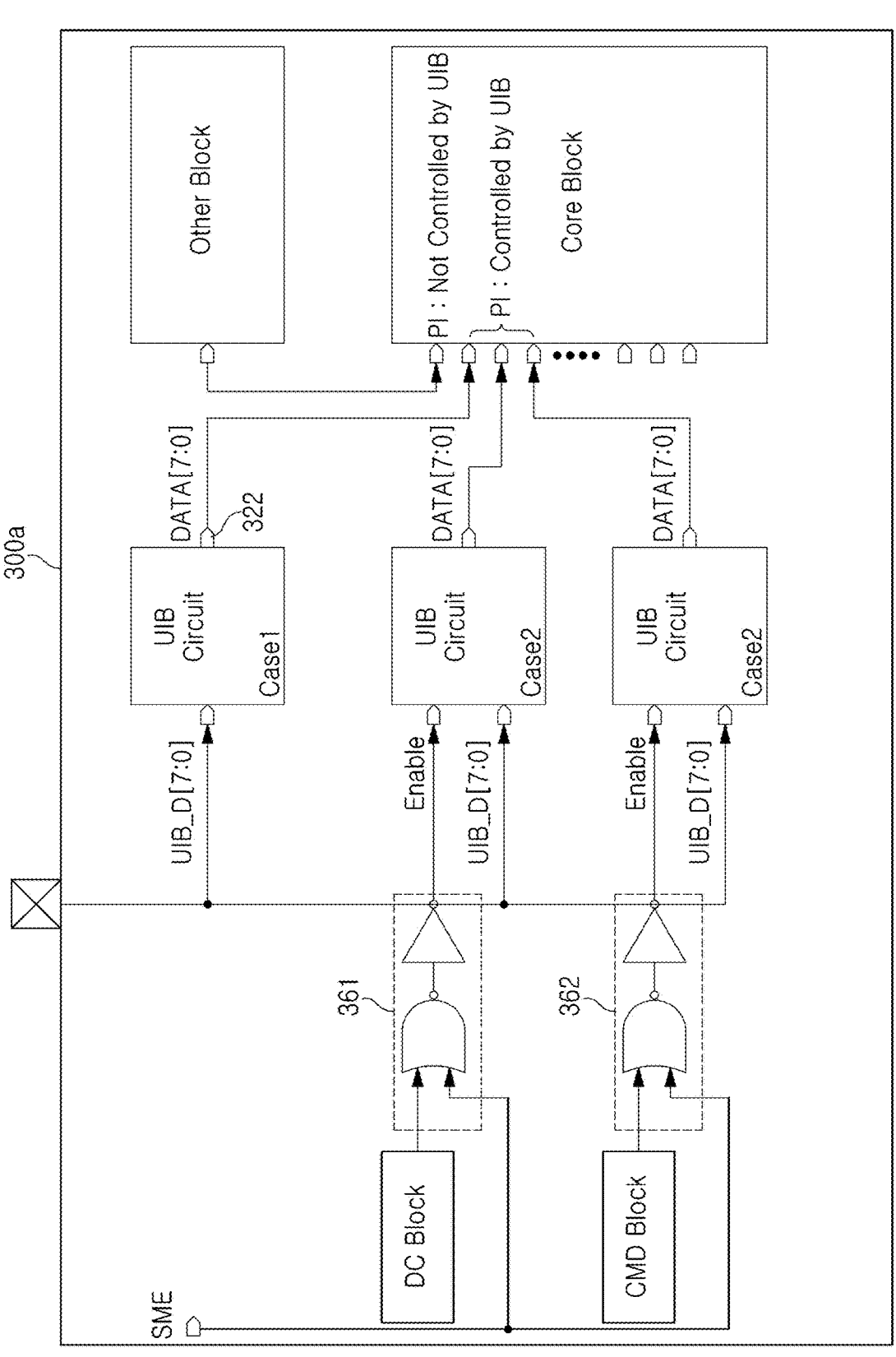
FIG. 8 is a diagram illustrating a nonvolatile memory device, according to an embodiment.

FIG. 8 is a diagram illustrating a nonvolatile memory device 300a, according to an embodiment. The nonvolatile memory device 300a of FIG. 8 may include and/or may be similar in many respects to the nonvolatile memory device 300 described above with reference to FIG. 5, and may include additional features not mentioned above. Consequently, repeated descriptions of the nonvolatile memory device 300a described above with reference to FIG. 5 may be omitted for the sake of brevity.

Referring to FIG. 8, the nonvolatile memory device 300a may further include scan mode output circuits (e.g., a first scan mode output circuit 361 and a second scan mode output circuit 362) when compared to the nonvolatile memory device 300 shown in FIG. 5. As shown in FIG. 8, in order to provide UIB controllability, each of the first and second scan mode output circuits 361 and 362 may receive a scan mode activation signal SME to activate UIB. In an embodiment, the scan mode activation signal SME may be input from an external pad and/or from a block inside a circuit.

Figure 9A:
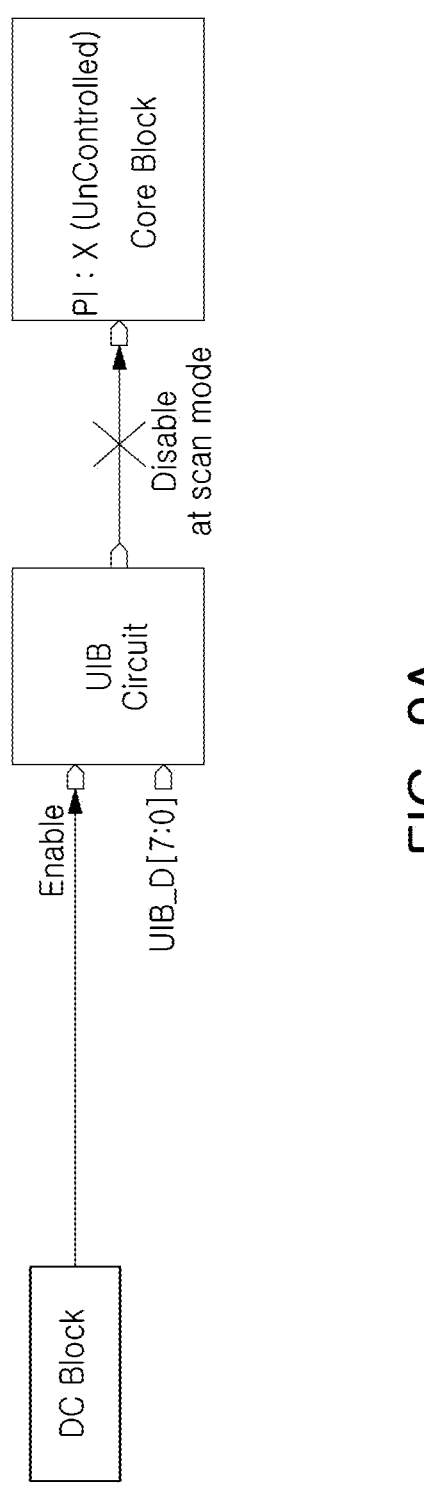
FIGS. 9A and 9B are diagrams exemplarily illustrating a case of entering a PI when UIB data is activated, according to an embodiment.
Figure 9B:
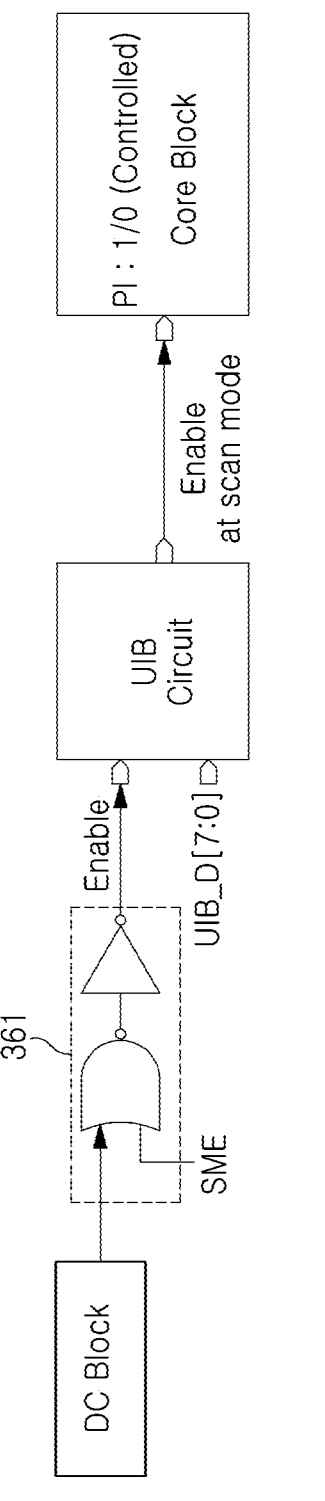

FIGS. 9A and 9B are diagrams exemplarily illustrating a case of entering a PI when UIB data is activated. Referring to FIG. 9A, when activated in a function mode, a UIB circuit is configured so that an output terminal is not activated in a scan mode. Accordingly, the PI of a core block may not be controllable. Alternatively or additionally, referring to FIG. 9B, when adding a scan mode output circuit 361 activated by the scan mode activation signal SME, even in the scan mode, the UIB circuit may be configured so that the output terminal is activated. Accordingly, the PI of the core block may be controllable.

Figure 10:
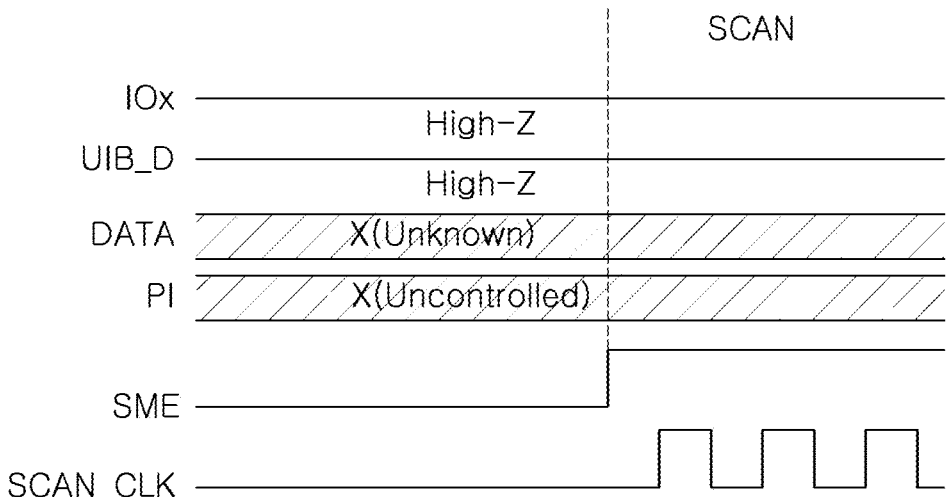
FIG. 10 is a diagram exemplarily illustrating a timing of a test operation of a related nonvolatile memory device, according to an embodiment.

FIG. 10 is a diagram exemplarily illustrating a timing of a test operation of a general nonvolatile memory device. Referring to FIG. 10, a scan test operation is described. Before a SCAN section, IOx and UIB_D may have no input values, and thus, may be maintained in a state of High-Z state. In such an embodiment, data in the UIB circuit may become Unknown. Accordingly, a scan mode may be entered without being able to provide the controllability of the PI into which the corresponding data enters.

Figure 11:
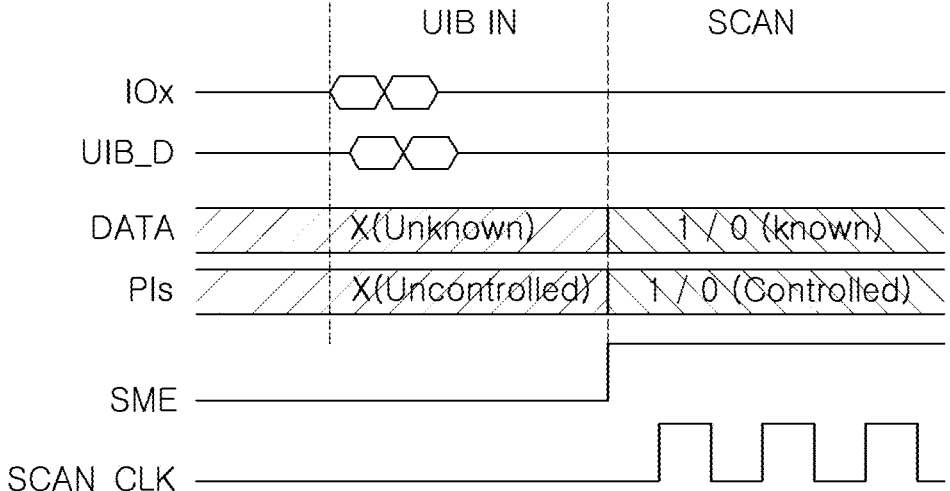
FIG. 11 is a diagram exemplarily illustrating a timing of a test operation of the nonvolatile memory device, according to an embodiment.

FIG. 11 is a diagram exemplarily illustrating a timing of a test operation of the nonvolatile memory device 300a, according to an embodiment. Referring to FIG. 11, a test operation of the nonvolatile memory device 300a may be described. A UIB input section may begin before the scan section. UIB data entered through the I/O pads IOx may be received on an input terminal UIB_D. When UIB activation is turned on, an output terminal DATA of a UIB circuit may be output as a PI. When the output terminal DATA is not entered at a time of being set on the input terminal UIB_D, due to an added new scan mode output circuit 361, a value may be set to the output terminal DATA when the scan mode activation signal SME is turned on regardless of the existing UIB Enable signal. Accordingly, the scan test may be performed in a state of providing the controllability of the PI in which the corresponding output terminal DATA is entered.

The nonvolatile memory device, according to an embodiment, may link the function operation of the nonvolatile memory device and the scan test, thereby potentially achieving test coverage with relatively little design overhead. The present disclosure is not limited to nonvolatile memory devices, and may be expanded to other products and/or devices that perform scan-based design-for-test (DFT) design, such as, but not limited to, a dynamic random access memory (DRAM), a system on chip (SoC), or the like. For example, an UIB circuit of the present disclosure may apply the UIB data to the PI of the scan core block before the scan test. Alternatively or additionally, in the UIB circuit of the present disclosure, the scan mode activation signal SME may be applied to an enable signal through an OR gate.

In the nonvolatile memory device, according to an embodiment, at least a portion or all (e.g., the entirety) of a control logic may be configured as a scan target circuit.

Figure 12:
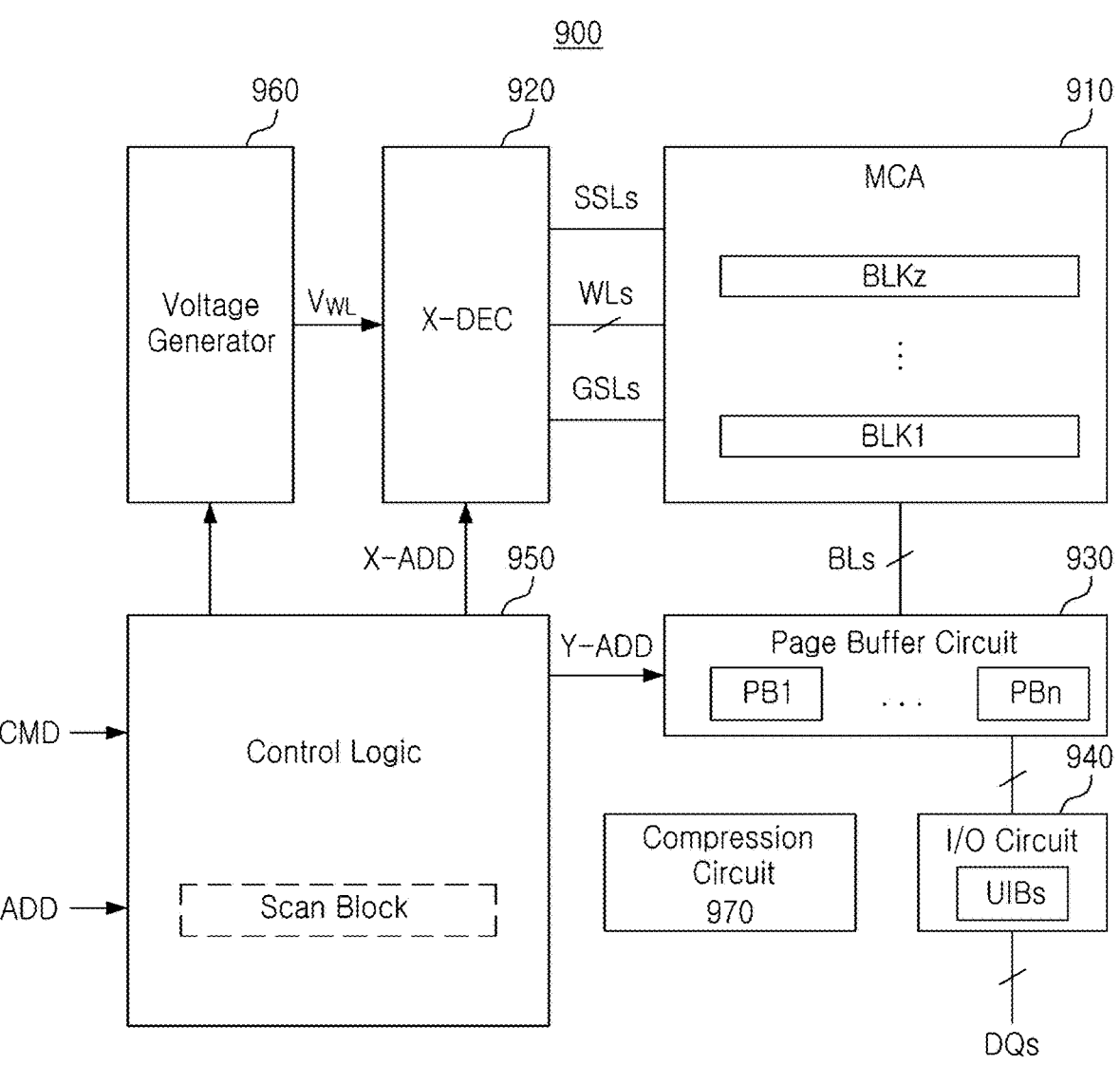
FIG. 12 is a diagram exemplarily illustrating a nonvolatile memory device, according to an embodiment.

FIG. 12 is a diagram illustrating a nonvolatile memory device 900, according to an embodiment. Referring to FIG. 12, the nonvolatile memory device 900 may include a memory cell array MCA 910, a row decoder X-DEC 920, a page buffer circuit 930, a plurality of I/O circuits 940, a control logic 950, a voltage generator 960, and a compression circuit 970.

The memory cell array MCA 910 may be connected to the row decoder X-DEC 920 through wordlines WL and/or select lines (e.g., string selection lines SSLs and/or ground selection lines GSLs). The memory cell array MCA 910 may be connected to the page buffer circuit 930 through bitlines BLs. The memory cell array MCA 910 may include a plurality of cell strings. Each channel of the cell strings may be formed in a vertical and/or horizontal direction. Each of the cell strings may include a plurality of memory cells. The plurality of memory cells may be programmed, erased, and/or read by voltage provided to the bitlines BLs and/or the wordlines WLs. In an embodiment, program operations may be performed in page units, and/or erase operations may be performed in block units. U.S. Pat. Nos. 7,679,133, 8,553,466, 8,654,587, 8,559,235, and 9,536,970 disclose memory cells, the disclosures of which are incorporated by reference herein in their entireties.

The row decoder X-DEC 920 may be configured to select one of the plurality of memory blocks BLK (e.g., a first memory block BLK1 to a z-th memory block BLKz, where z is positive integer greater than one (1)) of the memory cell array MCA 910 in response to the row address X-ADD from among the addresses ADD. The row decoder X-DEC 920 may select one of wordlines of a selected memory block in response to the address X-ADD. The row decoder X-DEC 920 may transmit a wordline voltage (e.g., VWL) corresponding to an operation mode to the wordline of the selected memory block. During a program operation, the row decoder X-DEC 920 may apply a program voltage and a verification voltage to the selected wordline, and may apply a pass voltage to an unselected wordline. During a read operation, the row decoder X-DEC 920 may apply a read voltage to the selected wordline, and may apply a read pass voltage to the unselected wordline.

The page buffer circuit 930 may be configured to operate as a write driver or a sense amplifier. During the program operation, the page buffer circuit 930 may apply a bitline voltage corresponding to data to be programmed to the bitlines (BLs) of the memory cell array MCA 910. During a read operation or verification read operation, the page buffer circuit 930 may detect data stored in the selected memory cell through the corresponding bitline. Each of a plurality of page buffers PB (e.g., a first page buffer PB1 to an n-th page buffer PBn, where n is a positive integer greater than one (1)) included in the page buffer circuit 930 may be connected to at least one bitline in response to a column address (Y-ADD) among the addresses ADD. In an example embodiment, each of the plurality of page buffers PB may be configured so that a sensing node and a transmission node may be separated from each other.

The plurality of I/O circuits 940 may provide externally provided data to the page buffer circuit 930. The plurality of I/O circuits 940 may provide an externally provided command CMD to the control logic 950. The plurality of I/O circuits 940 may provide an externally provided address ADD to the control logic 950. The plurality of I/O circuits 940 may output data detected and latched by the page buffer circuit 930 to the outside. The plurality of I/O circuits 940 may output compressed data CPR_SD stored in an encoding buffer 971 to the outside.

The control logic 950 may be configured to control the row decoder X-DEC 920, the page buffer circuit 930, the plurality of I/O circuits 940, the voltage generator 960, and the compression circuit 970 in response to a command CMD or a control signal transmitted from an external device. Additionally, the control logic 950 may be configured to perform a cell count-based dynamic read operation. The control logic 950 may output an address control signal ADDCS to the compression circuit 970 during a data compression operation. In an example embodiment, the address control signal ADDCS may include a first address control signal for reading soft decision data SDu in sector units from the plurality of page buffers PB and a second address control signal for writing compressed data CPR_SDu to the encoding buffer 971. In an embodiment, the control logic 950 may include a scan block in which all or some circuits may be used as a scan test target.

The voltage generator 960 may be configured to generate various types of wordline voltages to be applied to each wordline under the control of the control logic 950 and/or a well voltage to be supplied to a bulk (e.g., well area) in which the memory cells may be formed. Wordline voltages applied to the wordlines WLs may include, but not be limited to, a program voltage, a pass voltage, a read voltage, and a read pass voltage.

In an embodiment, the nonvolatile memory device 900 may include a cell counter. The cell counter may be configured to count memory cells corresponding to a specific threshold voltage range from data detected by the page buffer circuit 930. For example, the cell counter may process data detected in each of the plurality of page buffers PB, thus counting the number of memory cells having a threshold voltage within a specific threshold voltage range.

Figure 13:
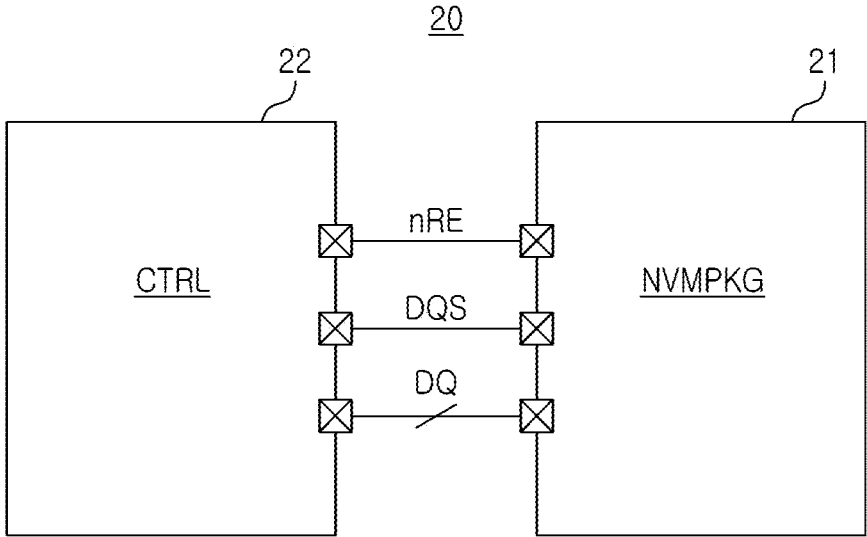
FIG. 13 is a diagram exemplarily illustrating a storage device, according to an embodiment.

FIG. 13 is a diagram exemplarily illustrating a storage device 20, according to an embodiment. Referring to FIG. 13, a storage device 20 may include a nonvolatile memory package NVMPKG 21 and a controller CTRL 22 controlling the nonvolatile memory package NVMPKG 21.

The nonvolatile memory package NVMPKG 21 may include an interface chip (or buffer chip) and a plurality of nonvolatile memory devices connected to internal channels. In an example embodiment, the nonvolatile memory package NVMPKG 21 may be configured to perform the scan test using the function mode or the UIB circuit, as described with reference to FIGS. 1 to 12. In an example embodiment, the interface chip may be connected to a controller CTRL 22 through a channel. The channel may be connected to a first internal channel and/or a second internal channel through an interface chip. The interface chip may internally include a retraining check circuit that may determine the need for retraining. Alternatively or additionally, the interface chip may compatibly implement an interface protocol for communicating with the controller CTRL 22 and/or an interface protocol for communicating with nonvolatile memory devices. A plurality of nonvolatile memory devices may be connected to each of the internal channels. In an example embodiment, nonvolatile memory devices of the nonvolatile memory package NVMPKG 21 may be configured in a stacked structure.

The controller CTRL 22 may be configured to control an overall operation of the nonvolatile memory package NVMPKG 21. The controller CTRL 22 may perform functions that may be necessary for data management of the nonvolatile memory package 91, such as, but not limited to, address mapping, error correction, garbage collection, wear-leveling, bad block management, data recovery, or the like. These data management functions may be implemented in hardware, software, firmware, and/or a combination thereof.

Figure 14:
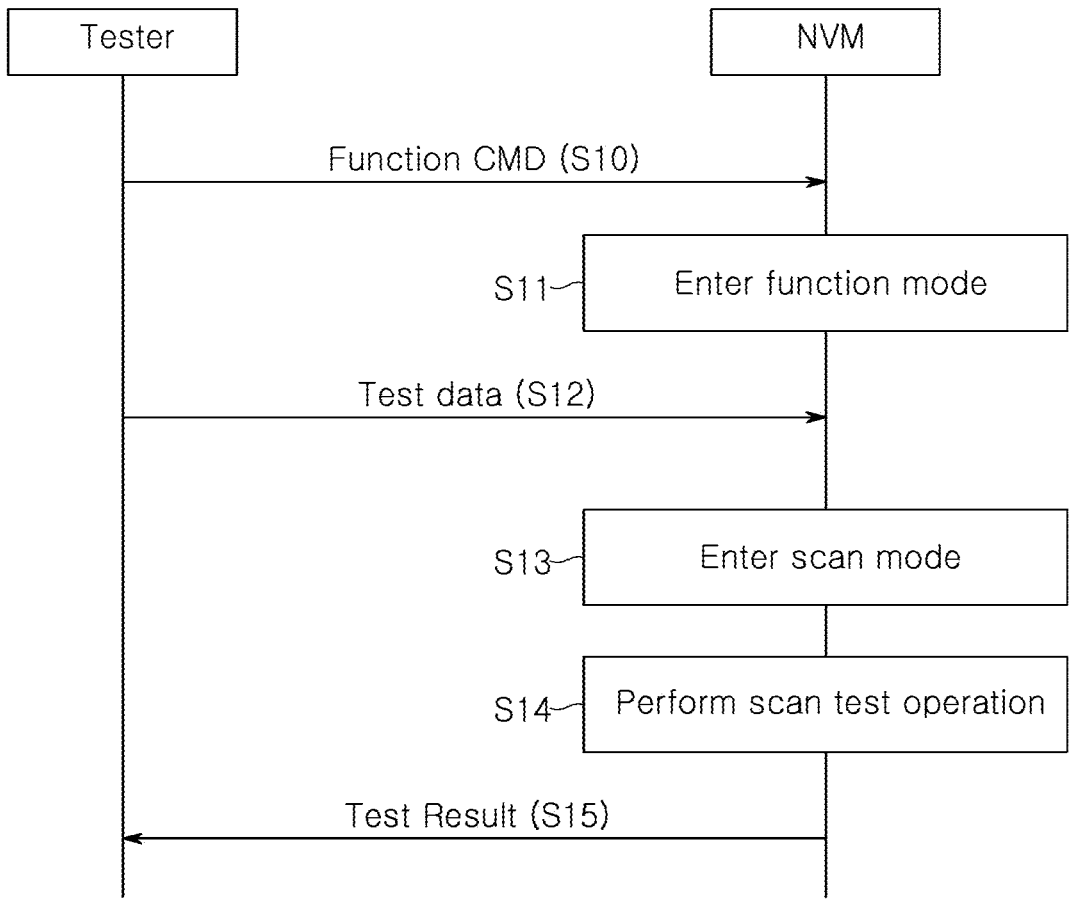
FIG. 14 is a ladder diagram illustrating a scan test operation of a test system, according to an embodiment.

FIG. 14 is a ladder diagram illustrating a scan test operation of a test system, according to an embodiment. Referring to FIG. 14, a scan test operation may proceed as follows. A tester may output function commands to a nonvolatile memory device NVM (operation S10). The nonvolatile memory device NVM may enter at least one scan block into the function mode in response to the function command (operation S11). The tester may apply test data to the I/O pads IOx of the nonvolatile memory device NVM (operation S12). The test data may be applied to the PI of the core block through at least one scan block. The tester may output a scan mode command to the nonvolatile memory device NVM. The nonvolatile memory device NVM may enter a scan mode in response to the scan mode command (operation S13). The nonvolatile memory device NVM may perform a scan test operation (operation S14). The nonvolatile memory device may output test result values to the tester through scan pads (e.g., scan pad 101 in FIG. 1) (operation S15).

Figure 15:
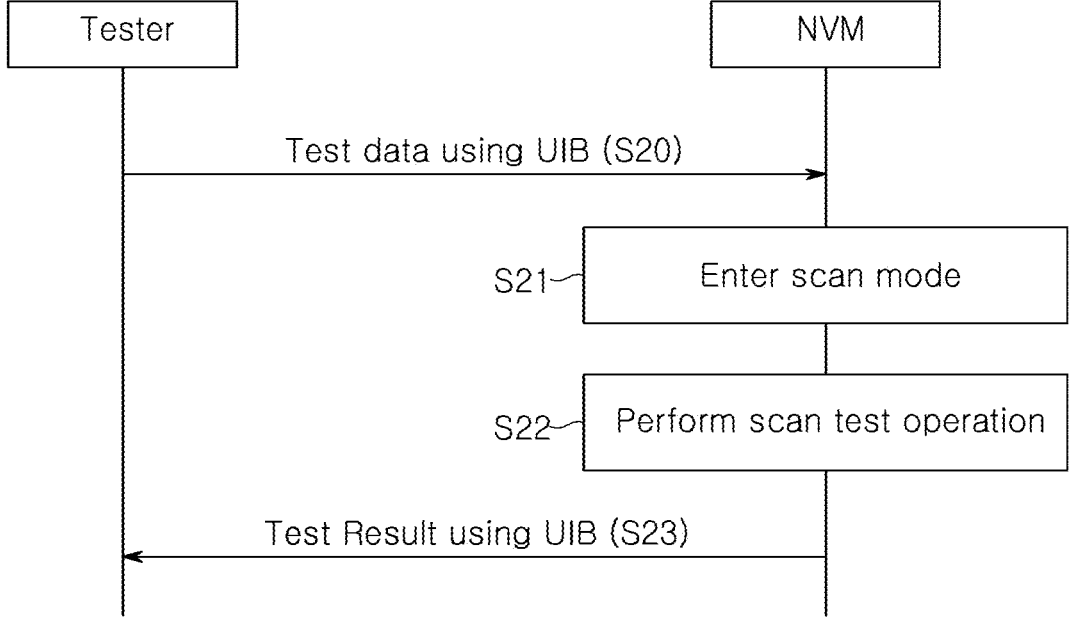
FIG. 15 is a ladder diagram illustrating a scan test operation of a test system, according to an embodiment.

FIG. 15 is a ladder diagram illustrating a scan test operation of a test system, according to an embodiment. Referring to FIG. 15, a scan test operation may proceed as follows. The tester may output test data to at least one UIB circuit of a nonvolatile memory device NVM (operation S20). The nonvolatile memory device NVM may enter a scan mode in response to a scan mode activation signal SME (operation S21). The scan mode activation signal SME may be input from the outside and/or may be generated internally. Test data may be applied to a PI of a core block through at least one UIB circuit. The nonvolatile memory device may perform a scan test operation (operation S22). The nonvolatile memory device may output test result values to the tester through the I/O pads IOx (operation S23).

The nonvolatile memory device, according to an embodiment, may be configured as a vertical memory device.

Figure 16:
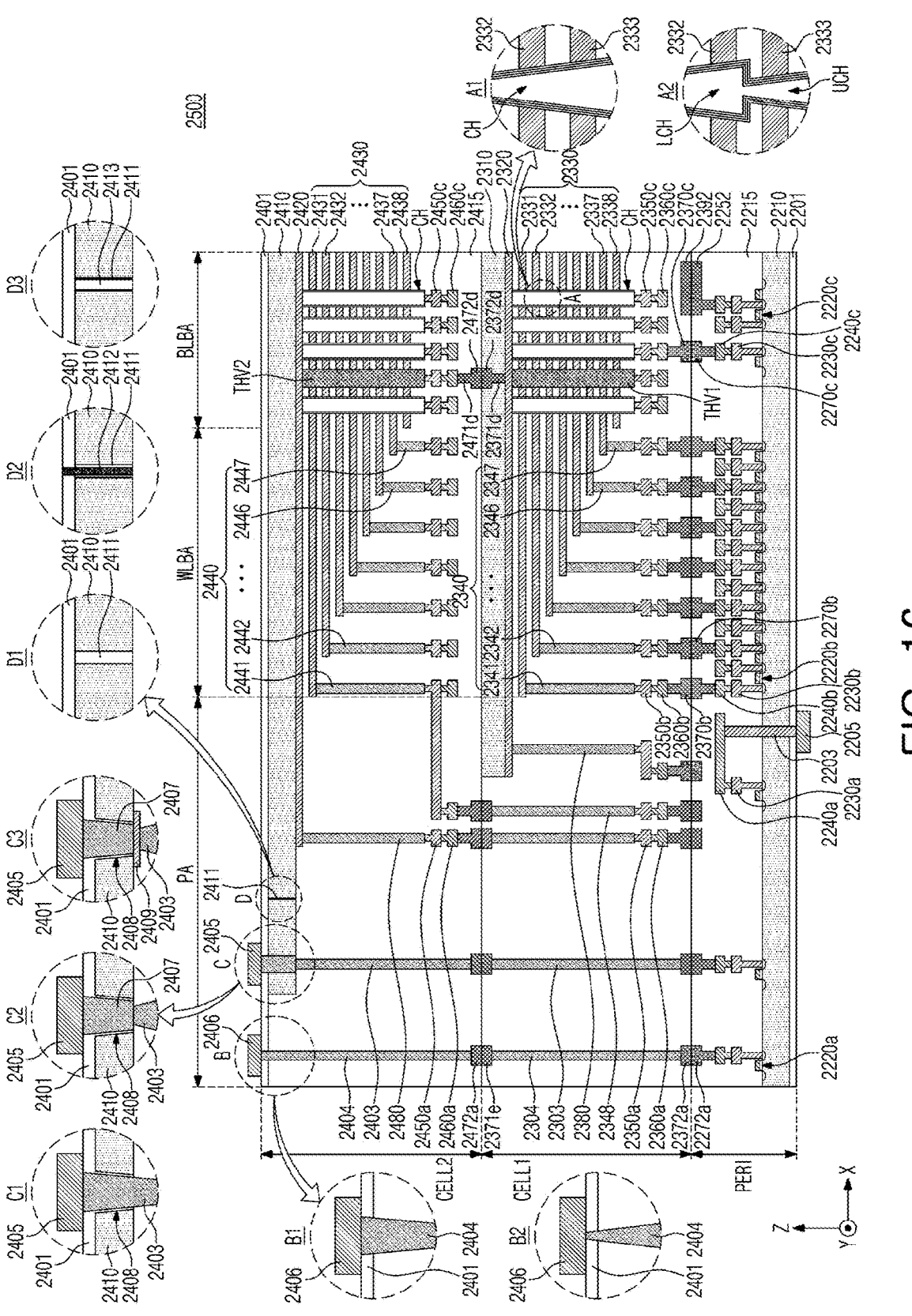
FIG. 16 is a diagram illustrating a vertical nonvolatile memory device, according to an embodiment.

FIG. 16 is a diagram illustrating a vertical nonvolatile memory device, according to an embodiment. Referring to FIG. 16, a nonvolatile memory device 2500 may have a chip-to-chip (C2C) structure. The C2C structure may refer to a structure obtained by connecting at least one upper chip including a cell region CELL and a lower chip including a peripheral circuit region PERI to each other by using a bonding method after separately manufacturing the at least one upper chip including the cell region CELL and the lower chip including the peripheral circuit region PERI. In an example embodiment, the bonding method may refer to a method of electrically and/or physically connecting a bonding metal pattern formed on an uppermost metal layer of the upper chip and a bonding metal pattern formed on an uppermost metal layer of the lower chip. For example, when bonding metal patterns are formed of copper (Cu), the bonding method may be referred to as a Cu—Cu bonding method. As another example, the bonding metal patterns may be formed of aluminum (Al) and/or tungsten (W). However, the present disclosure is not limited in this regard.

The nonvolatile memory device 2500 may include at least one upper chip including the cell region CELL. For example, as shown in FIG. 16, the nonvolatile memory device 2500 may be implemented to include two (2) upper chips. However, this is merely exemplary, and the number of upper chips is not limited thereto. When the nonvolatile memory device 2500 is implemented to include two (2) upper chips, a first upper chip including a first cell region CELL1, a second upper chip including a second cell region CELL2, and a lower chip including a peripheral circuit region PERI may be manufactured, and subsequently, the first upper chip, the second upper chip, and the lower chip may be connected to each other using a bonding method, thus manufacturing the nonvolatile memory device 2500.

In an embodiment, the first upper chip may be inverted and connected to the lower chip in the bonding method, and the second upper chip may also be inverted and connected to the first upper chip in the bonding method. Hereinafter, an upper portion and a lower portion of the first and the second upper chips may be referred to based on a time before the first upper chip and the second upper chip are inverted. That is, in FIG. 16, the upper portion of the lower chip may denote an upper portion defined based on a +Z-axis direction, and an upper portion of each of the first and second upper chips may denote an upper portion defined based on the −Z-axis direction. However, this is merely exemplary, and only one of the first upper chip and the second upper chip may be inverted and connected in the bonding method.

In the nonvolatile memory device 2500, each of the peripheral circuit region PERI and the first and second cell regions CELL1 and CELL2 may include an external pad bonding area PA, a wordline bonding area WLBA, and a bitline bonding area BLBA. The peripheral circuit region PERI may include a first substrate 2210 and a plurality of circuit elements (e.g., first circuit elements 2220a, second circuit elements 2220b, and third circuit elements 2220c) formed on the first substrate 2210. An interlayer insulating layer 2215 including one or more insulating layers may be provided on the plurality of circuit elements 2220a to 2220c, and a plurality of metal wirings connecting the plurality of circuit elements 2220a to 2220c may be provided in the interlayer insulating layer 2215. For example, the plurality of metal wirings may include first metal wirings (e.g., a first metal wiring 2230a, a second metal wiring 2230b, and a third metal wiring 2230c) connected to each of the plurality of circuit elements 2220a to 2220c, and second metal wirings (e.g., a fourth metal wiring 2240a, a fifth metal wiring 2240b, and a sixth metal wiring 2240c) formed on the first metal wirings 2230a to 2230c. The plurality of metal wirings may be formed of at least one of various conductive materials. For example, the first metal wirings 2230a to 2230c may be formed of a material having a relatively high electrical resistivity, such as, but not limited to tungsten (W). Alternatively or additionally, the second metal wirings 2240a to 2240c may be formed of a material having a relatively low electrical resistivity, such as, but not limited to, copper (Cu).

Although FIG. 16 illustrates the first metal wirings as having three (3) wirings (e.g., the first to third metal wirings 2230a to 2230c) and the second metal wirings as having three (3) wirings (e.g., the fourth to sixth metal wirings 2240a to 2240c), the present disclosure not limited thereto, and at least one additional metal wiring may be further formed on the second metal wirings 2240a to 2240c. In such embodiments, the second metal wirings 2240a to 2240c may be formed of aluminum (Al). Furthermore, at least some of the additional metal wirings formed on the second metal wirings 2240a to 2240c may be formed of copper (Cu), and the like, which may have a lower electrical resistivity than the aluminum (Al) of the second metal wirings 2240a to 2240c.

The interlayer insulating layer 2215 may be disposed on the first substrate 2210, and may include an insulating material such as, but not limited to, silicon oxide (SiO), silicon nitride (SiN), or the like.

Each of the first and second cell regions CELL1 and CELL2 may include at least one memory block. The first cell region CELL1 may include a second substrate 2310 and a common source line 2320. On the second substrate 2310, a plurality of wordlines 2330 (e.g., a first wordline 2331, a second wordline 2332, to a seventh wordline 2337, and an eighth wordline 2338) may be stacked in a direction (Z-axis direction), perpendicular to an upper surface of the second substrate 2310. String select lines and ground select lines may be disposed in an upper portion and a lower portion of the plurality of wordlines 2330, and the plurality of wordlines 2330 may be disposed between the string select lines and the ground select line. Similarly, the second cell region CELL2 may include a third substrate 2410 and a common source line 2420, and a plurality of wordlines 2430 (e.g., a first wordline 2431, a second wordline 2432, to a seventh wordline 2437, and an eighth wordline 2438) may be stacked in a direction (Z-axis direction), perpendicular to an upper surface of the third substrate 2410. The second substrate 2310 and the third substrate 2410 may be formed of various materials, which may include, for example, a silicon (Si) substrate, a silicon-germanium (Si—Ge) substrate, a germanium (Ge) substrate, or a substrate with a single crystalline epitaxial layer grown on a monocrystalline silicon substrate. A plurality of channel structures CH may be formed in each of the first and second cell regions CELL1 and CELL2.

In an example embodiment, as shown in region A1 of FIG. 16, the channel structure CH may be provided in the bitline bonding area BLBA, and may extend in a direction, perpendicular to the upper surface of the second substrate 2310 and penetrate through the plurality of wordlines 2330, the string select lines, and the ground select lines. The channel structure CH may include a data storage layer, a channel layer, and a buried insulating layer. The channel layer may be electrically connected to a first metal wiring 2350c and a second metal wiring 2360c in the bitline bonding area BLBA. For example, the second metal wiring 2360c may be a bitline, and may be connected to the channel structure CH through the first metal wiring 2350c. The bitline 2360c may extend in a first direction (Y-axis direction), parallel to the upper surface of the second substrate 2310.

In an example embodiment, as shown in region A2 of FIG. 16, the channel structure CH may include a lower channel LCH and an upper channel UCH that may be connected to each other. For example, the channel structure CH may be formed through a process for the lower channel LCH and a process for the upper channel UCH. The lower channel LCH may extend in a direction, perpendicular to the upper surface of the second substrate 2310, and may penetrate through the common source line 2320 and the lower first and second wordlines 2331 and 2332. The lower channel LCH may include a data storage layer, a channel layer, and a buried insulating layer, and may be connected to the upper channel UCH. The upper channel UCH may penetrate through the upper wordlines 2333 to 2338. The upper channel UCH may include a data storage layer, a channel layer, and a buried insulating layer, and a channel layer of the upper channel UCH may be electrically connected to the first metal wiring 2350c and the second metal wiring 2360c. As a length of the channel increases, it may be difficult to form a channel having a constant width due to process reasons. The nonvolatile memory device 2500, according to an embodiment, may be provided with a channel having improved width uniformity through the lower channel LCH and the upper channel UCH formed through a sequential process.

As illustrated in region A2, when the channel structure CH is formed to include the lower channel LCH and the upper channel UCH, a wordline disposed near a boundary of the lower channel LCH and the upper channel UCH may be a dummy wordline. For example, the second and third wordlines 2332 and 2333 that form the boundary between the lower channel LCH and the upper channel UCH may be dummy wordlines. In this case, data may not be stored in memory cells connected to the dummy wordline. Alternatively or additionally, the number of pages corresponding to memory cells connected to the dummy wordline may be less than the number of pages corresponding to memory cells connected to a typical wordline. A voltage level applied to the dummy wordline may be different from the voltage level applied to a related wordline, thus potentially reducing an influence of non-uniform channel widths between the lower channel LCH and the upper channel UCH on an operation of the nonvolatile memory device 2500.

Continuing to refer to region A2, the number of lower wordlines 2331 and 2332 through which the lower channel LCH penetrates is illustrated as being less than the number of upper wordlines 2333 to 2338 through which the upper channel UCH penetrates. However, this is merely exemplary, and the present disclosure is not limited thereto. In an example embodiment, the number of lower wordlines through which the lower channel LCH penetrates may be formed to be greater than or equal to the number of upper wordlines penetrated by the upper channel UCH. Furthermore, a structure and a connection relationship of the channel structure CH disposed in the first cell region CELL1 described above may be equally applied to a channel structure CH disposed in the second cell region CELL2.

In the bitline bonding area BLBA, a first through-electrode via (TSV) THV1 may be provided in the first cell region CELL1, and a second TSV THV2 may be provided in the second cell region CELL2. As illustrated in FIG. 16, the first TSV THV1 may penetrate through the common source line 2320 and the plurality of wordlines 2330. However, this is merely exemplary, and the first TSV THV1 may further penetrate through the second substrate 2310. The first TSV THV1 may include a conductive material. Alternatively or additionally, the first TSV THV1 may include a conductive material surrounded by an insulating material. The second TSV THV2 may also be provided in a substantially similar and/or the same shape and with the same structure as the first TSV THV1.

In an example embodiment, the first TSV THV1 and the second TSV THV2 may be electrically connected through a first through-metal pattern 2372d and a second through-metal pattern 2472d. The first through-metal pattern 2372d may be formed on a lower end of the first upper chip including the first cell region CELL1, and the second through-metal pattern 2472d may be formed on an upper end of the second upper chip including the second cell region CELL2. The first TSV THV1 may be electrically connected to the first metal wiring 2350c and the second metal wiring 2360c. A lower via 2371d may be formed between the first TSV THV1 and the first through-metal pattern 2372d, and an upper via 2471d may be formed between the second TSV THV2 and the second through-metal pattern 2472d. The first through-metal pattern 2372d and the second through-metal pattern 2472d may be connected to each other in a bonding method.

Furthermore, in the bitline bonding area BLBA, an upper metal pattern 2252 may be formed on an uppermost metal layer of the peripheral circuit region PERI, and an upper metal pattern 2392 having the same shape as the upper metal pattern 2252 may be formed on an uppermost metal layer of the first cell region CELL1. The upper metal pattern 2392 of the first cell region CELL1 and the upper metal pattern 2252 of the peripheral circuit region PERI may be electrically connected to each other in a bonding method. In the bitline bonding area BLBA, the bitline 2360c may be electrically connected to a page buffer included in the peripheral circuit region PERI. For example, some of the third circuit elements 2220c in the peripheral circuit region PERI may provide a page buffer, and the bitline 2360c may be electrically connected to the third circuit elements 2220c providing the page buffer, through an upper bonding metal 2370c of the first cell region CELL1 and an upper bonding metal 2270c of the peripheral circuit region PERI.

Continuing to refer to FIG. 16, in the wordline bonding area WLBA, the wordlines 2330 of the first cell region CELL1 may extend in a second direction (X-axis direction), parallel to an upper surface of the second substrate 2310, and may be connected to a plurality of cell contact plugs 2340 (e.g., a first cell contact plug 2341, a second cell contact plug, to a sixth cell contact plug 2346, and a seventh cell contact plug 2347). A first metal wiring 2350b and a second metal wiring 2360*b* may be sequentially connected to an upper portion of the cell contact plugs 2340 connected to the plurality of wordlines 2330. The cell contact plugs 2340 may be connected to the peripheral circuit region PERI through an upper bonding metal 2370*b* of the first cell region CELL1 and an upper bonding metal 2270*b* of the peripheral circuit region PERI in the wordline bonding area WLBA.

The cell contact plugs 2340 may be electrically connected to a row decoder included in the peripheral circuit region PERI. For example, some of the plurality of circuit elements 2220*a* to 2220*c* of the peripheral circuit region PERI may provide a row decoder, and the cell contact plugs 2340 may be electrically connected to the plurality of circuit elements 2220*a* to 2220*c* providing the row decoder, through the upper bonding metal 2370*b* of the first cell region CELL1 and the upper bonding metal 2270*b* of the peripheral circuit region PERI. In an example embodiment, an operating voltage of plurality of circuit elements 2220*a* to 2220*c* providing the row decoder may be different from an operating voltage of the third circuit elements 2220*c* providing the page buffer. For example, the operating voltage of the third circuit elements 2220*c* providing the page buffer may be greater than the operating voltage of the second circuit elements 2220*b* providing the row decoder.

Similarly, in the wordline bonding area WLBA, the wordlines 2430 of the second cell region CELL2 may extend in a second direction (X-axis direction), parallel to the upper surface of the third substrate 2410, and may be connected to a plurality of cell contact plugs 2440 (e.g., a first cell contact plug 2441, a second cell contact plug 2442, to a sixth cell contact plug 2446, and a seventh cell contact plug 2447). The cell contact plugs 2440 may be connected to the peripheral circuit region PERI through an upper metal pattern of the second cell region CELL2, a lower metal pattern and an upper metal pattern of the first cell region CELL1, and the cell contact plug 2348.

In the wordline bonding area WLBA, an upper bonding metal 2370*b* may be formed in the first cell region CELL1, and an upper bonding metal 2270*b* may be formed in the peripheral circuit region PERI. The upper bonding metal 2370*b* of the first cell region CELL1 and the upper bonding metal 2270*b* of the peripheral circuit region PERI may be electrically connected to each other in a bonding method. The upper bonding metal 2370*b* and the upper bonding metal 2270*b* may be formed of a material such as, but not limited to, aluminum (Al), copper (Cu), tungsten (W), or the like.

In the external pad bonding area PA, a lower metal pattern 2371*e* may be formed in a lower portion of the first cell region CELL1, and an upper metal pattern 2472*a* may be formed in an upper portion of the second cell region CELL2. The lower metal pattern 2371*e* of the first cell region CELL1 and the upper metal pattern 2472*a* of the second cell region CELL2 may be connected in a bonding method in the external pad bonding area PA. Similarly, an upper metal pattern 2372*a* may be formed in an upper portion of the first cell region CELL1, and an upper metal pattern 2272*a* may be formed in an upper portion of the peripheral circuit region PERI. The upper metal pattern 2372*a* of the first cell region CELL1 and the upper metal pattern 2272*a* of the peripheral circuit region PERI may be connected in bonding method.

Common source line contact plugs (e.g., a first common source line contact plug 2380 and a second common source line contact plug 2480) may be disposed in the external pad bonding area PA. The first and second common source line contact plugs 2380 and 2480 may be formed of a conductive material such as, but not limited to, metal, a metal compound, doped polysilicon, or the like. The first common source line contact plug 2380 of the first cell region CELL1 may be electrically connected to the common source line 2320, and the second common source line contact plug 2480 of the second cell region CELL2 may be electrically connected to the common source line 2420. A first metal wiring 2350*a* and a second metal wiring 2360*a* may be sequentially stacked on the common source line contact plug 2380 of the first cell region CELL1, and a first metal wiring 2450*a* and a second metal wiring 2460*a* may be sequentially stacked on the second common source line contact plug 2480 of the second cell region CELL2.

A plurality of I/O pads (e.g., a first I/O pad 2205, a second I/O pad 2405, and a third I/O pad 2406) may be disposed in the external pad bonding area PA. Referring to FIG. 16, a lower insulating film 2201 may cover a lower surface of the first substrate 2210, and a first I/O pad 2205 may be formed on the lower insulating film 2201. The first I/O pad 2205 may be connected to at least one of the plurality of circuit elements 2220*a* to 2220*c* disposed in the peripheral circuit region PERI through a first I/O contact plug 2203, and may be separated from the first substrate 2210 by the lower insulating film 2201. Additionally, a side insulating film may be disposed between the first I/O contact plug 2203 and the first substrate 2210 to electrically separate the first I/O contact plug 2203 and the first substrate 2210.

An upper insulating film 2401 may be formed on the third substrate 2410 to cover the upper surface of the third substrate 2410. A second I/O pad 2405 or a third I/O pad 2406 may be disposed on the upper insulating film 2401. The second I/O pad 2405 may be connected to at least one of the plurality of circuit elements 2220*a* to 2220*c* disposed in the peripheral circuit region PERI through the second I/O contact plugs 2403 and 2303, and the third I/O pad 2406 may be connected to at least one of the plurality of circuit elements 2220*a* to 2220*c* disposed in the peripheral circuit region PERI through the third I/O contact plugs 2404 and 2304.

In an example embodiment, the third substrate 2410 may not be disposed in a region in which the I/O contact plug is disposed. For example, as illustrated in region B of FIG. 16, the third I/O contact plug 2404 may be separated from the third substrate 2410 in a direction, parallel to the upper surface of the third substrate 2410, and may penetrate through an interlayer insulating layer 2415 of the second cell region CELL2 and may be connected to the third I/O pad 2406. In such an embodiment, the third I/O contact plug 2404 may be formed in various processes.

For example, as shown in region B1 of FIG. 16, the third I/O contact plug 2404 may extend in a third direction (Z-axis direction), and may be formed so that a diameter thereof may increase toward the upper insulating film 2401. That is, a diameter of the channel structure CH as described with reference to region A1 may be formed to decrease as the channel structure CH approaches the upper insulating film 2401, while the diameter of the third I/O contact plug 2404 may be formed to increase as the third I/O contact plug 2404 approach the upper insulating film 2401. For example, the third I/O contact plug 2404 may be formed after the second cell region CELL2 and the first cell region CELL1 are coupled to each other in the bonding method.

As another example, as shown in region B2 of FIG. 16, the third I/O contact plug 2404 may extend in the third direction (Z-axis direction), and may be formed so that a diameter thereof decreases toward the upper insulating film 2401. That is, similarly to the channel structure CH, the diameter of the third I/O contact plug 2404 may be formed to decrease as the third I/O contact plug 2404 approaches the upper insulating film 2401. For example, the third I/O contact plug 2404 may be formed together with the cell contact plugs 2440 before bonding the second cell region CELL2 and the first cell region CELL1.

In an example embodiment, the I/O contact plug may be disposed to overlap the third substrate 2410. For example, as shown in regions C1, C2, and C3 of FIG. 16, the second I/O contact plug 2403 may be formed by penetrating through the interlayer insulating layer 2415 of the second cell region CELL2 in the third direction (Z-axis direction), and may be electrically connected to the second I/O pad 2405 through the third substrate 2410. In such an example, a connection structure of the second I/O contact plug 2403 and the second I/O pad 2405 may be implemented in various manners.

For example, as shown in region C1 of FIG. 16, an opening 2408 penetrating through the third substrate 2410 may be formed, and the second I/O contact plug 2403 may be directly connected to the second I/O pad 2405 through the opening 2408 formed in the third substrate 2410. In such an example, as shown in region C1, the diameter of the second I/O contact plug 2403 may be formed to increase as it approaches the second I/O pad 2405. However, this is merely exemplary, and the diameter of the second I/O contact plug 2403 may be formed to become smaller as it approaches the second I/O pad 2405.

In an embodiment, as shown in region C2 of FIG. 16, an opening 2408 penetrating through the third substrate 2410 may be formed, and a contact 2407 may be formed in the opening 2408. One end of the contact 2407 may be connected to the second I/O pad 2405 and the other end may be connected to the second I/O contact plug 2403. Accordingly, the second I/O contact plug 2403 may be electrically connected to the second I/O pad 2405 through the contact 2407 in the opening 2408. In such an embodiment, as shown in region C2, a diameter of the contact 2407 may be formed to increase toward the second I/O pad 2405 and a diameter of the second I/O contact plug 2403 may be formed to decrease toward the second I/O pad 2405. For example, the third I/O contact plug 2403 may be formed together with the cell contact plugs 2440 before bonding between the second cell region CELL2 and the first cell region CELL1, and the contact 2407 may be formed after bonding between the second cell region CELL2 and the first cell region CELL1.

In an embodiment, as shown in region C3 of FIG. 16, a stopper 2409 may be further formed on an upper surface of the opening 2408 of the third substrate 2410, as compared with region C2. The stopper 2409 may be a metal wiring formed on a substantially similar and/or the same layer as the common source line 2420. However, this is merely exemplary, and the stopper 2409 may be a metal wiring formed on a substantially similar and/or the same layer as at least one of the plurality of wordlines 2430. The second I/O contact plug 2403 may be electrically connected to the second I/O pad 2405 through the contact 2407 and the stopper 2409.

Similar to the second and third I/O contact plugs 2403 and 2404 of the second cell area CELL2, the second and third I/O contact plugs 2303 and 2304 of the first cell area CELL1 may be formed so that a diameter thereof decreases toward the lower metal pattern 2371e, or the diameter thereof increases toward the lower metal pattern 2371e, respectively.

According to embodiments, a slit 2411 may be formed in the third substrate 2410. For example, the slit 2411 may be formed in any position of the external pad bonding area PA. In an example embodiment, as shown in regions D1, D2, and D3 of FIG. 16, the slit 2411 may be disposed between the second I/O pad 2405 and the cell contact plugs 2440 when viewed on a plan view. However, this is merely exemplary, and when viewed on a plan view, the slit 2411 may be formed so that the second I/O pad 2405 is disposed between the slit 2411 and the cell contact plugs 2440.

For example, as shown in region D1 of FIG. 16, the slit 2411 may be formed to penetrate through the third substrate 2410. When forming the opening 2408, for example, the slit 2411 may be used for preventing the third substrate 2410 from being finely split. However, this is exemplary, and the slit 2411 may be formed to have a depth of about 60% to 70% with respect to a thickness of the third substrate 2410.

Furthermore, in an embodiment, as shown in region D2, a conductive material 2412 may be formed in the slit 2411. The conductive material 2412 may be used, for example, to discharge a leakage current generated during driving of circuit elements in the external pad bonding area PA to the outside. In such an embodiment, the conductive material 2412 may be connected to an external ground line.

As another example, as shown in region D3 of FIG. 16, an insulating material 2413 may be formed in the slit 2411. The insulating material 2413 may be formed to electrically separate, for example, the second I/O pad 2405 and the second I/O contact plug 2403 disposed in the external pad bonding area PA from the wordline bonding area WLBA. By forming the insulating material 2413 in the slit 2411, it may be possible to block a voltage provided through the second I/O pad 2405 from affecting the metal layer disposed on the third substrate 2410 in the wordline bonding area WLBA.

According to example embodiments, the first to third I/O pads 2205 to 2406 may be selectively formed. For example, the nonvolatile memory device 2500 may be implemented to include only the first I/O pad 2205 disposed on the first substrate 2210, to include only the second I/O pad 2405 disposed on the third substrate 2410, and/or to include only the third I/O pad 2406 disposed on the upper insulating film 2401.

According to example embodiments, at least one of the second substrate 2310 of the first cell region CELL1 and the third substrate 2410 of the second cell region CELL2 may be used as a sacrificial substrate, and the substrate may be completely or partially removed before or after a bonding process. An additional layer may be stacked after the substrate is removed. For example, the second substrate 2310 of the first cell region CELL1 may be removed before or after bonding between the peripheral circuit region PERI and the first cell region CELL1, and an insulating layer covering an upper surface of the common source line 2320 or a conductive layer for connection may be formed. Similarly, the third substrate 2410 of the second cell region CELL2 may be removed before or after bonding between the first cell region CELL1 and the second cell region CELL2, and an upper insulating layer 2401 covering an upper surface of the common source line 2420 or a conductive layer for connection may be formed.

The peripheral circuit region PERI illustrated in FIG. 16 may correspond to a scan block (or a core block) to be tested as described with reference to FIGS. 1 to 15, and may include at least one circuit for performing a scan test operation using a function mode/UIB circuit.

The device described with reference to FIGS. 1 to 16 may be implemented in a hardware component, a software component, and/or a combination of hardware components and software components. For example, the devices and components described in an example embodiment may be implemented using a processor, a controller, an arithmetical logic units (ALU), a digital signal processor, a microcomputer, a field programmable gate array (FPGA), a programmable logic unit (PLU), a microprocessor, or one or more general purpose computers or special purpose computers, such as any other device capable of executing and responding to instructions. The processing device may perform an operating system (OS) and one or more software applications executed on the operating system. Furthermore, the processing device may access, store, manipulate, process and generate data in response to the execution of software. For convenience of understanding, there are cases in which one processing device is described as being used, but those of ordinary skill in the art may know that the processing device may include a plurality of processing elements or a plurality of types of processing elements. For example, the processing device may include a plurality of processors or one processor and one controller. Furthermore, other processing configurations, such as a parallel processor, are also possible.

The software may include a computer program, a code, an instruction, or a combination of one or more thereof, and may configure a processing device to operate as desired or command the processing device independently or collectively. Software and/or data may be embodied in any type of machine, component, physical device, virtual device, computer storage medium or device, in order to be interpreted by the processing device or to provide instructions or data to the processing device. The software may be distributed on a networked computer system and stored or executed in a distributed manner. The software and data may be stored on one or more computer-readable recording media.

In the present disclosure, providing the controllability of the PI is configured through a function operation rather than a wrapper. By applying a function mode through the command, an operation after entering the function mode may be held, and a scan test may be performed by inputting the scan data. It may be possible to designate a new command for the scan test and provide scalability to a Function+Scan mode. In a mass production test pattern, there may be a function test before SI of ATPG is applied. When there are a large number of PI/PO of Scan Core BLK, most of the cases may not have a wrapper or TPI in the PI/PO. Application technologies such as the corresponding technology may be used at any time due to the issue of increasing Net-Die.

The above-described aspects of the present disclosure are only example embodiments for implementing the present disclosure. The present disclosure may include not only specific and practically available means itself, but also technical concepts that are abstract and conceptual ideas that may be used as technologies in the future.

What is claimed is:

1. A nonvolatile memory device, comprising:
at least one first universal interface bus (UIB) circuit coupled to a plurality of input/output (I/O) pads;
at least one second UIB circuit coupled to the plurality of I/O pads;
a core block comprising:
a first input terminal coupled to another block; and
a plurality of second input terminals coupled to a first output terminal of the at least one first UIB circuit and a second output terminal of the at least one second UIB circuit; and at least one block configured to activate the at least one second UIB circuit.

2. The nonvolatile memory device of claim 1, wherein the nonvolatile memory device further comprises a memory cell region comprising:
a plurality of memory cells coupled to a plurality of wordlines and a plurality of bitlines; and
a peripheral region configured to control the memory cell region,
wherein the peripheral region comprises at least one circuit corresponding to the core block.

3. The nonvolatile memory device of claim 1, wherein the at least one first UIB circuit is configured to, in a scan mode, prevent activation of the first output terminal of the at least one first UIB circuit, and
wherein the at least one second UIB circuit is configured to, in the scan mode, activate the second output terminal of the at least one second UIB circuit.

4. The nonvolatile memory device of claim 3, wherein the at least one first UIB circuit and the at least one second UIB circuit are configured to determine the scan mode based on a scan mode activation signal.

5. The nonvolatile memory device of claim 1, wherein the at least one second UIB circuit is configured, in a UIB section, to:
receive test data; and
apply the test data to at least one input terminal of the plurality of second input terminals of the core block coupled to the second output terminal of the at least one second UIB circuit.

6. The nonvolatile memory device of claim 5, wherein the core block is configured to:
perform a scan test operation using the test data, based on a scan clock in a scan section.

7. The nonvolatile memory device of claim 1, wherein the at least one block is further configured to output an activation signal, and
wherein the nonvolatile memory device further comprises a scan mode output circuit configured to:
receive at least one of the activation signal or a scan mode activation signal; and
activate the at least one second UIB circuit based on the at least one of the activation signal or the scan mode activation signal.

8. The nonvolatile memory device of claim 7, wherein the scan mode output circuit comprises:
a logic circuit configured to perform an OR operation on the activation signal and the scan mode activation signal; and
an inverter configured to invert an output value of the logic circuit.

9. The nonvolatile memory device of claim 8, wherein the logic circuit is further configured to:
input the scan mode activation signal from at least one of an external pad or an internal circuit.

10. The nonvolatile memory device of claim 1, wherein the core block is configured to:
output result values of a scan test operation through a plurality of scan pads.

* * * * *